(12) United States Patent
Fan et al.

(10) Patent No.: US 6,404,222 B1
(45) Date of Patent: Jun. 11, 2002

(54) CHIP CAPACITANCE MEASUREMENT CIRCUIT

(75) Inventors: Chen-Teng Fan; Jyh-Herng Wang, both of Hsinchu Hsien (TW)

(73) Assignee: Faraday Technology Corp., Hsinchu (TW)

( * ) Notice: Subject to any disclaimer, the term of this patent is extended or adjusted under 35 U.S.C. 154(b) by 22 days.

(21) Appl. No.: 09/631,342

(22) Filed: Aug. 2, 2000

(30) Foreign Application Priority Data

Jun. 14, 2000 (TW) ........................................ 089111584

(51) Int. Cl.$^7$ .............................................. G01R 31/26
(52) U.S. Cl. ........................ 324/765; 324/519; 324/769
(58) Field of Search ................................ 324/681, 765, 324/519, 678, 769

(56) References Cited

U.S. PATENT DOCUMENTS 4,795,964 A * 1/1989 Mahant Shetti et al. .... 324/681
5,999,010 A * 12/1999 Arora et al. ................. 324/765
6,300,765 B1 * 10/2001 Chen ........................... 324/519

OTHER PUBLICATIONS

McGaughy et al. (A Simple Method For On Chip, Sub-Femto Farad Interconnect Capacitance Measurement) IEEE Jan. 1997, pp. 21–23.*

Proc. IEEE 1997, Int. Conference on Microelectronic Test Structure, vol. 10, pp. 77–80, Mar. 1997.

* cited by examiner

Primary Examiner—N. Le
Assistant Examiner—Vincent Q. Nguyen
(74) Attorney, Agent, or Firm—J.C. Patents

(57) ABSTRACT

A silicon chip capacitance measurement circuit including three pairs of completely matched MOS transistors divided into two symmetrical circuits. Capacitance of a capacitor within the silicon chip is measured using the difference in average charging current flowing from the measurement circuit via a left and a right capacitor. A power supply provides a constant voltage source to the measurement circuit. A current measuring device measures the current flowing from the power supply to the measurement circuit. A signal generator provides a group of three-phase non-overlapping signals to the measurement circuit. The capacitance measurement circuit is able to limit measurement error due to the return of different size negative currents leading to the transient switching of MOS transistors in the current measurement device so that accuracy of capacitance measurement improves.

15 Claims, 5 Drawing Sheets

CHIP CAPACITANCE MEASUREMENT CIRCUIT

CROSS-REFERENCE TO RELATED APPLICATION

This application claims the priority benefit of Taiwan application serial no. 89111584, filed Jun. 14, 2000.

BACKGROUND OF THE INVENTION

1. Field of Invention

The present invention relates to a capacitance measurement circuit. More particularly, the present invention relates to a measurement circuit for measuring the capacitance of a metallic parasitic capacitor on a silicon chip.

2. Description of Related Art

In semiconductor fabrication, metallic interconnects are often used to link up various devices. Due to the coupling between a metallic interconnect and a substrate or between pairs of metallic interconnects, metallic parasitic capacitance are formed. Since the response of a transistor is often delayed by the presence of metallic parasitic capacitance, the magnitude of the parasitic capacitance is preferably measured in advance so that its overall effect on chip performance can be accessed.

Parasitic capacitance can be directly measured by a high-precision capacitor meter. However, direct measurement of capacitance by a capacitor meter is feasible only for the measurement of capacitance in the pico-farad (PF) range (that is, $10^{-12}$ Farad). Due to rapid progress in semiconductor manufacturing technologies, the width of metallic interconnects continues to shrink to a smaller dimension. Hence, magnitude of the metallic parasitic capacitance in a silicon chip correspondingly decreases to the femto-farad (FF) range (that is, $10^{-15}$ Farad). For such a small capacitance, the value of parasitic capacitance can no longer be accurately measured by a capacitor meter.

The conventional method of measuring a low capacitance value includes the use of a charge-based capacitance measurement (CBCM) circuit. FIG. 1 is a schematic circuit diagram of a conventional CBCM circuit. The capacitance measurement circuit actually comprises of two pairs of symmetrical and matching MOS transistor circuits. One transistor circuit includes a pair of PMOS transistors 106 and 110 while the other transistor circuit includes a pair of NMOS transistors 108 and 112.

As shown in FIG. 1, a current meter 102 is serially connected between a power supply 100 and PMOS transistor 106 on the left side of the capacitance measurement circuit. Current meter 102 measures the current flowing from power source 100 to the source terminal of PMOS transistor 106. Another current meter 104 on the right side of the capacitance measurement circuit is serially connected to power source 100 and PMOS transistor 110. Similarly, current meter 104 measures the current flowing from power source 100 to the source terminal of PMOS transistor 110.

On the left side, the drain terminal of PMOS transistor 106 and the drain terminal of NMOS transistor 108 are connected in parallel with a m1 metal strip 114. Assume that the parasitic capacitor formed between metal strip 114 and the substrate has a capacitance $C_{wire}$. Similarly on the right side, the drain terminal of PMOS transistor 110 and the drain terminal of NMOS transistor 112 are connected in parallel with a m1 metal strip 116. Assume the parasitic capacitor that is formed from m1 metal strip 116 and a m2 metal strip 118 has a capacitance of $C_x$ and the parasitic capacitor that forms from m1 metal strip 116 and the substrate has a capacitance $C_{wire}$. Metal strip 118 is connected to the ground. In addition, m1 metal strip 114 and m1 metal strip 116 are symmetrical to each other. With such a configuration, the metallic parasitic capacitance measured via the drain terminal of PMOS transistor 110 should be $C_{wire}+C_x$.

The gate terminal of PMOS transistor 106 and the gate terminal of PMOS transistor 110 are connected in parallel to the output terminal V1 of a signal generator 120. The gate terminal of NMOS transistor 108 and the gate terminal of NMOS transistor 112 are connected in parallel to another output terminal V2 of signal generator 120. The source terminal of NMOS transistor 108 and the source terminal of NMOS transistor 112 are connected in parallel to the ground.

FIG. 2 is a timing diagram showing the signals needed for a conventional CBCM circuit during operation. As shown in FIG. 2, control signals needed for the CBCM circuit are generated by signal generator 120. Signal generator 120 issues control signals V1 to the gate terminal of PMOS transistor 106 and the gate terminal of PMOS transistor 110. Signal generator 120 also issues control signals V2 to the gate terminal of NMOS transistor 108 and the gate terminal of NMOS transistor 112. Ideally, a conventional CBCM circuit should operate in steps according to the timing diagram in FIG. 2. The steps includes:

Step one: During time interval $t_0$–$t_1$, all MOS transistors are in the shut-off state, and both current meters 102 and 104 register a zero current;

Step two: During time interval time $t_1$–$t_2$, PMOS transistor 106 and PMOS transistor 110 are in a conductive state while NMOS transistor 108 and NMOS transistor 112 are in a shut-off state. During this period, capacitor $C_{wire}$ (that is, m1 metal strip 114) and capacitor $C_{wire}+C_x$ (that is, m1 metal strip 116 and m2 metal strip 118) are charged. Consequently, currents of different values pass through the respective current meters 102 and 104;

Step three: During time interval $t_2$–$t_3$, all MOS transistors are in the shut-off state, and both current meters 102 and 104 register a zero current;

Step four: During time interval $t_3$–$t_4$, both PMOS transistors 106 and 110 are in a shut-off state while both NMOS transistors 108 and 112 are in a conductive state. During this period, capacitor $C_{wire}$ (that is, m1 metal strip 114) and capacitor $C_{wire}+C_x$ (that is, m1 metal strip 116 and m2 metal strip 118) are discharged.

In the aforementioned four steps, the average current flowing through current meter 102 is $I_{wire}$ and the average current flowing through current meter 104 is $I_{wire+x}$.

The value of capacitance $C_x$ can be deduced using the following formulae:

$$I_{wire+x}=(C_{wire}+C_x)\cdot Vdd\cdot f;$$

$$I_{wire}=C_{wire}\cdot Vdd\cdot f;$$

$$C_x = \frac{I_{wire+x} - I_{wire}}{Vdd\cdot f},$$

where f is the frequency (as shown in FIG. 2).

In practice, at time $t_2$, PMOS transistor 106 and PMOS transistor 110 begin to change from a conductive state to a shut-off state while NMOS transistor 108 and NMOS transistor 112 are in a shut-off state. An equivalent capacitance between the source terminal and the gate terminal of PMOS transistor 106 can be obtained by looking up the gate terminal of PMOS transistor 106. Similarly, an equivalent capacitance between the source terminal and the gate terminal of PMOS transistor 106 and the capacitor $C_{wire}$ can be obtained by looking down the gate terminal of PMOS transistor 106. Similarly, an equivalent capacitance between the source terminal and the gate terminal of PMOS transistor 110 can be obtained by looking up the gate terminal of PMOS transistor 110. An equivalent capacitance between the source terminal and the gate terminal of PMOS transistor 110 and the capacitor $C_{wire}+C_x$ can be obtained by looking down the gate terminal of PMOS transistor 110.

FIG. 3 is a graph showing the time trace of negative current produced by a conventional CBCM circuit through a SPICE simulation. At time $t_2$ (control signal V1 304 changes from a ground voltage to a voltage Vdd as shown in FIG. 3), a negative current $i_{wire}$ returns from the gate terminal of PMOS transistor 106 to current meter 102 and a negative current $I_{wire+x}$ returns from the gate terminal of PMOS 110 to current meter 103. As shown in FIG. 3, negative current $i_{wire}$ 302 differs from negative current $I_{wire+x}$ 300 because capacitance looking into the lower portion from the gate terminal of PMOS transistor 110 is greater than the capacitance looking into the lower portion from the gate terminal of PMOS transistor 106 by Cx. The difference between negative current $i_{wire}$ 302 and negative current $i_{wire+x}$ 300 often leads to an error in the measurement of capacitance $C_x$.

SUMMARY OF THE INVENTION

Accordingly, one object of the present invention is to provide a capacitance measurement circuit capable of limiting measurement error due to the return of different size negative currents leading to the transient switching of MOS transistors to current measurement devices so that accuracy of capacitance measurement is increased.

To achieve these and other advantages and in accordance with the purpose of the invention, as embodied and broadly described herein, the invention provides a chip capacitance measurement circuit. The measurement circuit includes a plurality of MOS transistors formed into a pair of symmetrical circuits. The chip capacitance measurement circuit utilizes the difference in average current flowing to the respective left capacitance and right capacitance of the measurement circuit. A power supply provides power to the measurement circuit. A current measuring device is installed between the power supply and the measurement circuit for measuring the value of the current flowing from the power source to the measuring circuit. A signal generator is coupled to the measurement circuit for providing a set of control signals to the measurement circuit.

The signal generator provides control signals to the measurement circuit such that the MOS transistors within the measurement circuit are conductive or shut in sequential order. Since the negative current that returns to the current measuring device originally generated by the respective symmetrical components of the measurement circuit are identical, capacitance of the chip capacitor can be accurately measured.

This invention also provides a capacitance measurement circuit for measuring chip capacitance. The capacitance measurement circuit includes a measurement circuit, a power supply, a first current meter, a second current meter and a signal generator. The first current meter and the second current meter are devices coupled between the power supply and the measurement circuit. The first and second current meters are used for measuring the values of current flowing from the power supply to the respective symmetrical component circuits of the measurement circuit. The signal generator is coupled to the measurement circuit for providing a set of control signals to the measurement circuit. The measurement circuit includes a first pair of completely matched MOS transistors, a second pair of completely matched MOS transistors and a third pair of completely matched MOS transistors. The first pair of MOS transistors comprises of a first PMOS transistor and a second PMOS transistor. The source terminal of the first PMOS transistor is connected to the first current meter. The source terminal of the second PMOS transistor is connected to the second current meter. The gate terminal of the first PMOS transistor and the gate terminal of the second PMOS transistor are connected in parallel to the first output terminal of the signal generator. The second pair of MOS transistors comprises of a third PMOS transistor and a fourth PMOS transistor. The source terminal of the third PMOS transistor is connected to the drain terminal of the first PMOS transistor. The source terminal of the fourth PMOS transistor is connected to the drain terminal of the second PMOS transistor. The gate terminal of the third PMOS transistor and the gate terminal of the fourth PMOS transistor are connected in parallel to the second output terminal of the signal generator. The third pair of MOS transistors comprises of a first NMOS transistor and a second NMOS transistor. The drain terminal of the first NMOS transistor is connected to the drain terminal of the third PMOS transistor and one terminal of the left wire capacitor while the other terminal of the left wire capacitor is connected to ground. The drain terminal of the second NMOS transistor is connected to the drain terminal of the fourth PMOS transistor, one terminal of the right wire capacitor and one terminal of a to-be-measured capacitor, while the other terminal of the right wire capacitor and the other terminal of the to-be-measured capacitor are both connected to the ground. The gate terminal of the first NMOS transistor and the gate terminal of the second NMOS transistor are connected in parallel to the third output terminal of the signal generator. The source terminal of the first NMOS transistor and the source terminal of the second NMOS transistor are connected in parallel to the ground.

The signal generator provides control signals to the measurement circuit so that the first pair of PMOS transistors, the second pair of PMOS transistors and the third pair of NMOS transistors are conductive or shut in sequential order. Since the negative current that returns to the first current meter and the second current meter originally generated by the respective symmetrical components of the measurement circuit are identical, capacitance of the chip capacitor can be accurately measured.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
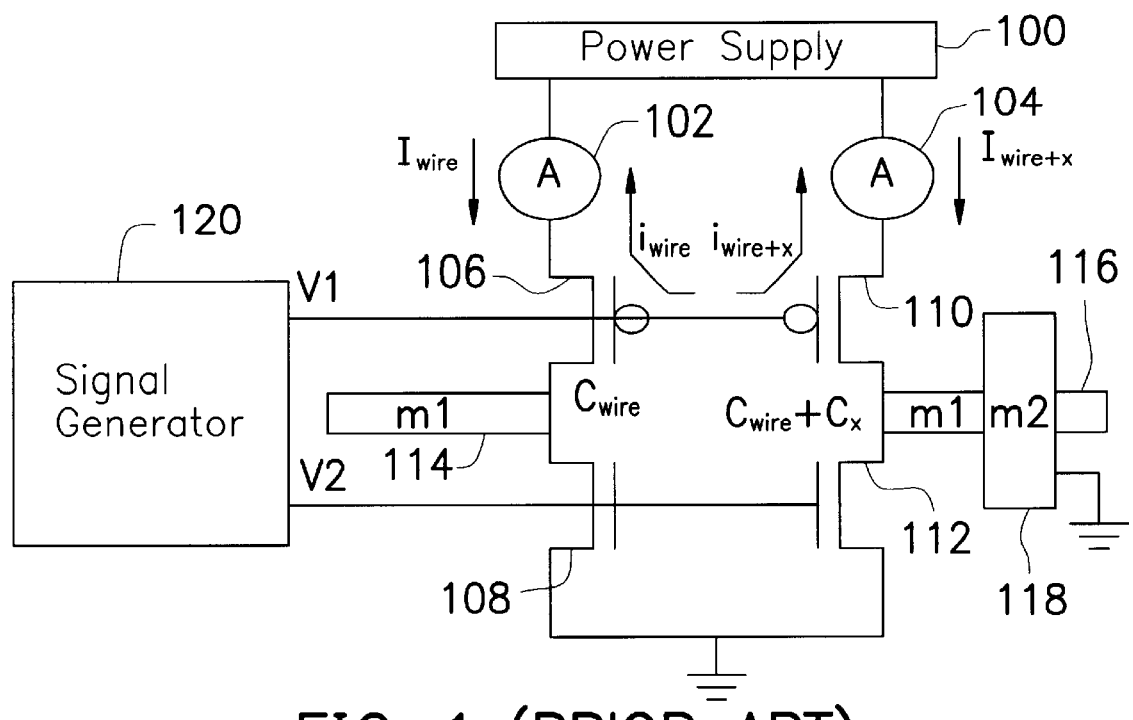
FIG. 1 is a schematic circuit diagram of a conventional CBCM circuit.
Figure 2:
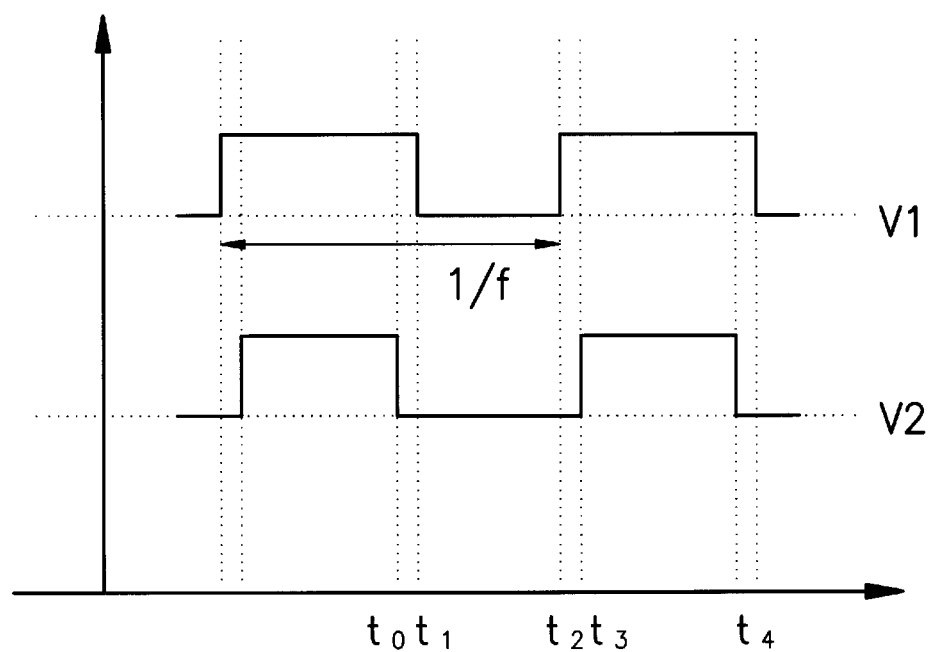
FIG. 2 is a timing diagram showing the signals needed for a conventional CBCM circuit during operation.
Figure 3:
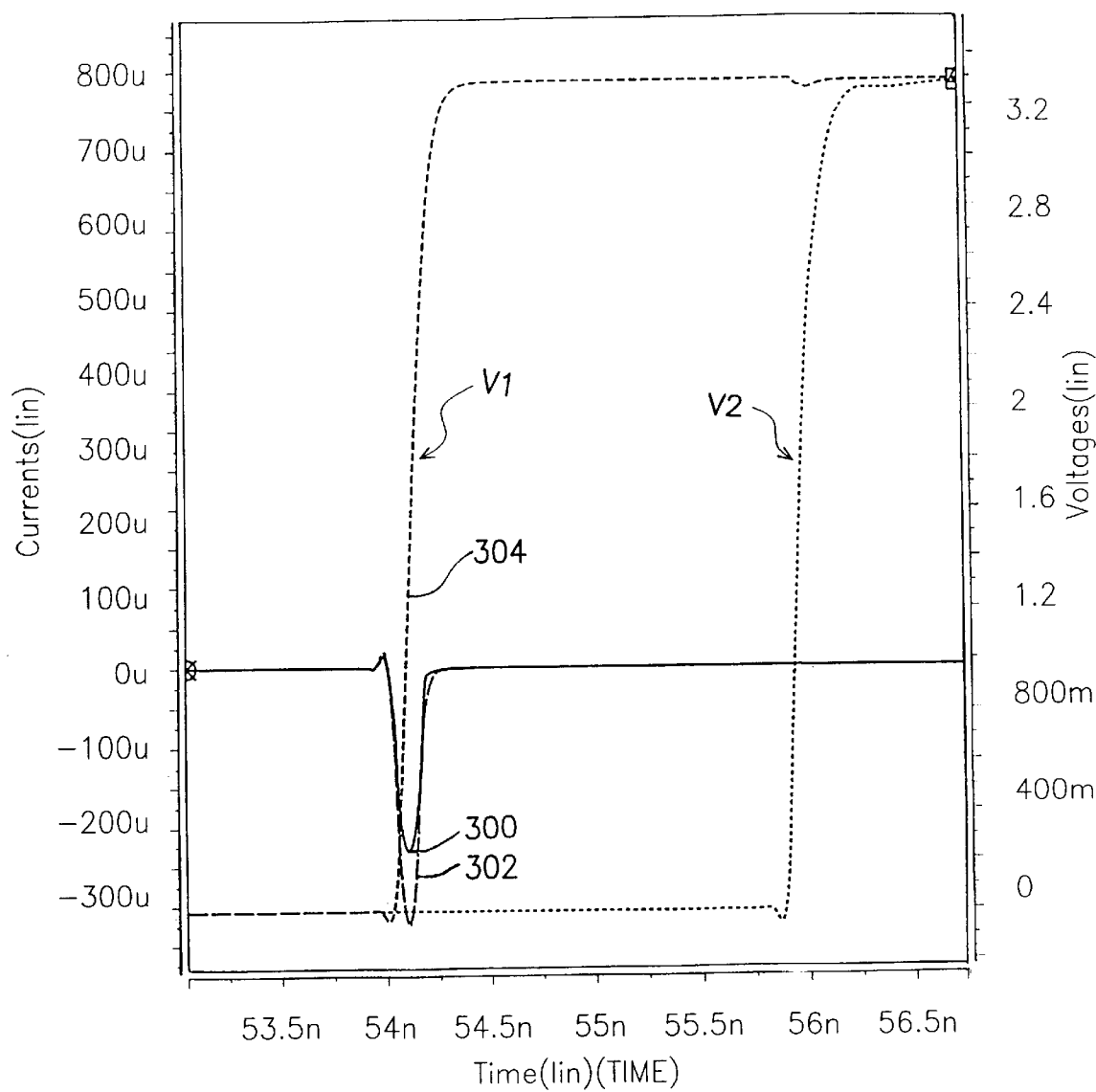
FIG. 3 is a graph showing the time trace of negative current produced by a conventional CBCM circuit through a SPICE simulation.

Reference will now be made in detail to the present preferred embodiments of the invention, examples of which are illustrated in the accompanying drawings. Wherever possible, the same reference numbers are used in the drawings and the description to refer to the same or like parts.

Figure 4:
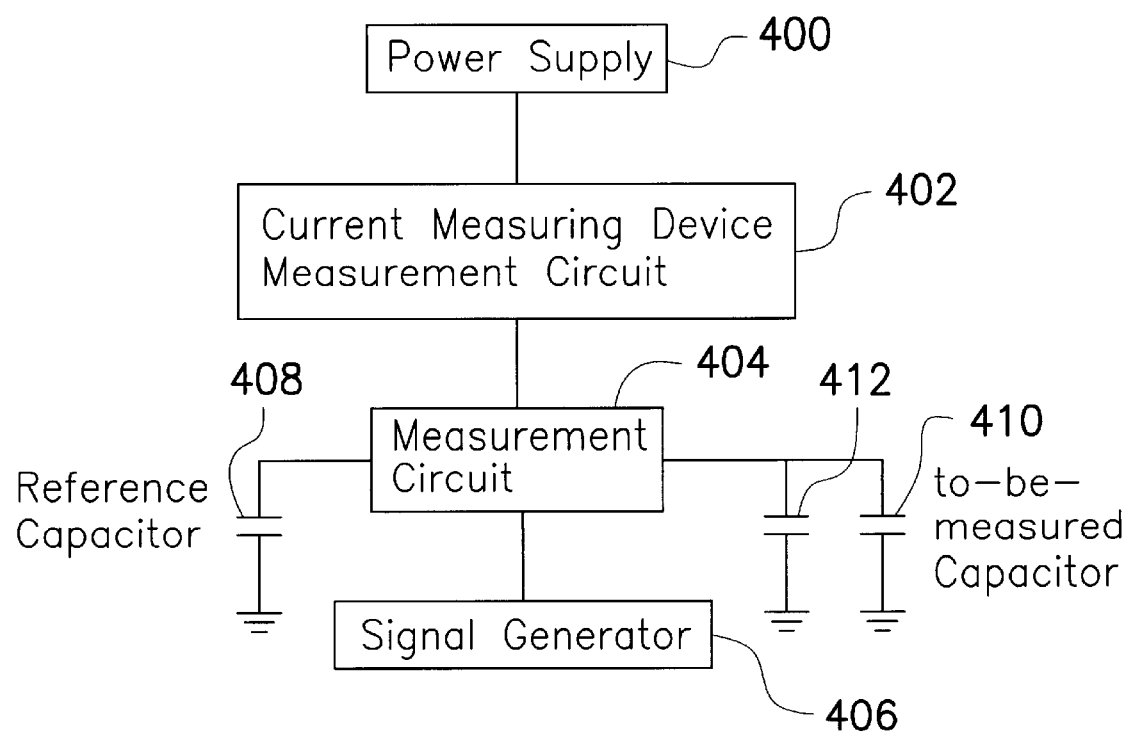
FIG. 4 is a block diagram showing a capacitance measurement circuit for a silicon chip according to this invention.

FIG. 4 is a block diagram showing a capacitance measurement circuit for silicon chip according to this invention. As shown in FIG. 4, the capacitance measurement circuit 404 comprises of three pairs of matching MOS transistors divided into two symmetrical circuits. Each symmetrical circuit includes two PMOS transistors and one NMOS transistor. Measurement circuit 404 utilizes the difference in the average current flowing to a left capacitor and a right capacitor to measure a capacitor 410. The left side capacitor is a left wire capacitor 408 and the right side capacitor is a right wire capacitance 412 and to-be-measured capacitor 410. Both left wire capacitor 408 and right wire capacitor 412 can be a parasitic capacitance formed between a chip metallic line and the substrate, and to-be-measured capacitor 410 can be a parasitic capacitance formed between two chip metallic lines.

A power supply 400 powers measurement circuit 404. Power supply 400 actually provides a voltage source to measurement circuit 404. A current measuring device 402 measures the current flowing from power supply 400 into measurement circuit 404. Current measuring device 402 can be a current meter. A signal generator 406 provides a group of three-phase non-overlapping control signals to measurement circuit 404.

By providing three-phase non-overlapping signals to measurement circuit 404, signal generator 406 is able to switch on or off MOS transistors inside measurement circuit 404 in sequential order. Hence, the negative currents generated by the symmetrical circuits of measurement circuit 404 and returned to the current measuring device 402 are identical so that capacitance of to-be-measured capacitor 410 can be precisely measured.

Figure 5:
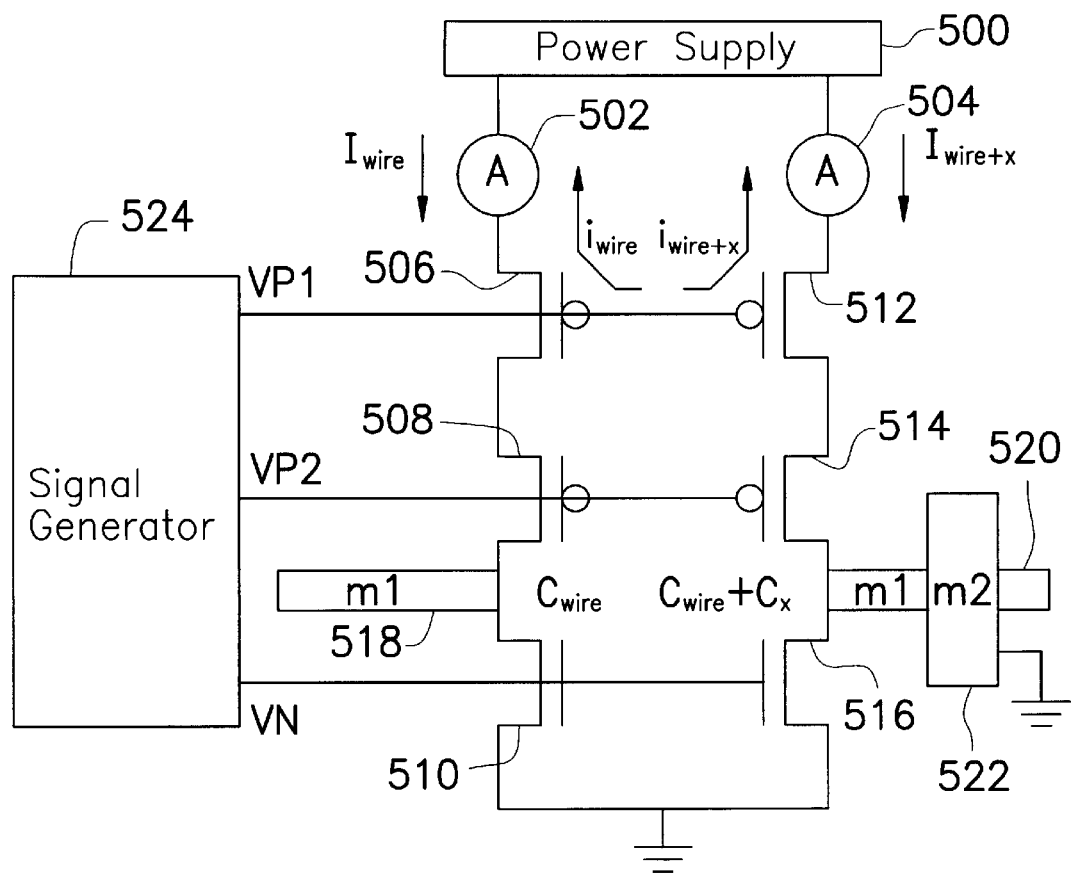
FIG. 5 is a block diagram showing the capacitance measurement circuit for a silicon chip according to one preferred embodiment of this invention.

FIG. 5 is a block diagram showing the capacitance measurement circuit for a silicon chip according to one preferred embodiment of this invention. As shown in FIG. 5, a current meter 502 on the left side of measurement circuit 404 is connected to a power supply 500 and the source terminal of a PMOS transistor 506. Current meter 502 is used for measuring the current flowing from power supply 500 to the source terminal of PMOS transistor 506. Similarly, a current meter 504 on the right side of measurement circuit 404 is connected to power supply 500 and the source terminal of a PMOS transistor 512. Current meter 504 is used for measuring the current flowing from power supply 500 to the source terminal of PMOS transistor 512. Power supply 500 actually provides a constant voltage Vdd to measurement circuit 404.

The drain terminal of PMOS transistor 506 is connected to the source terminal of PMOS transistor 508. The drain terminal of PMOS transistor 512 is connected to the source terminal of PMOS transistor 514. The gate terminal of PMOS transistor 506 and the gate terminal of PMOS transistor 512 are connected in parallel to a first output terminal VP1 of signal generator 524.

The drain terminal of PMOS transistor 508 and the drain terminal of NMOS transistor 510 are connected in parallel to m1 metal strip 518. Assume left wire capacitance between m1 metal strip 518 and the substrate has a capacitance value $C_{wire}$. The drain terminal of PMOS transistor 514 and the drain terminal of NMOS transistor 516 are connected in parallel to m1 metal strip 520. Assume to-be-measured capacitor between m1 metal strip 520 and m2 metal strip 522 has a capacitance $C_x$ and assume right wire capacitor between m1 metal strip 520 and substrate has a capacitance $C_{wire}$. Metal strip 522 is connected to the ground. Since m1 metal strip 518 and m1 metal strip 520 are symmetrically laid inside the chip, the capacitance of metallic parasitic capacitor looking into the drain terminal of PMOS transistor 514 is $C_{wire}+C_x$.

The gate terminal of PMOS transistor 508 and the gate terminal of PMOS transistor 514 are connected in parallel to the second output terminal VP2 of signal generator 524. The gate terminal of NMOS transistor 510 and the gate terminal of NMOS transistor 516 are connected in parallel to the third output terminal VN of signal generator 524. Both the source terminal of NMOS transistor 510 and the source terminal of NMOS transistor 516 are connected in parallel to the ground.

Figure 6:
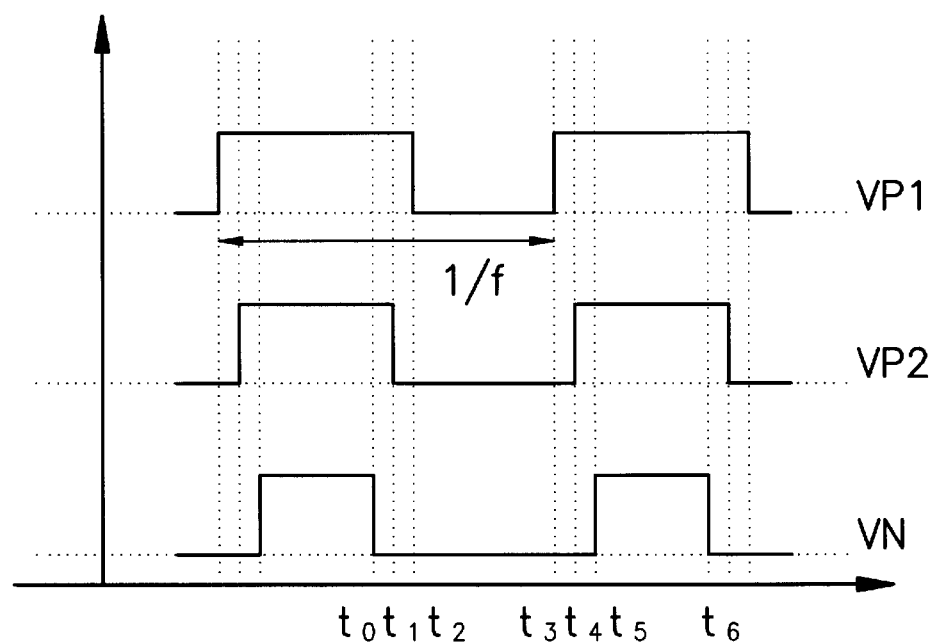
FIG. 6 is a timing diagram showing the input signal needed for the capacitance measurement circuit of this invention.

FIG. 6 is a timing diagram showing the control signals needed for the capacitance measurement circuit of this invention. In FIG. 5, control signals needed for the measurement circuit are provided by signal generator 524. Signal generator 524 submits a control signal VP1 and VP2 to the gate terminal of PMOS transistor 506 and the gate terminal of PMOS transistor 512. Signal generator 524 also submits a control signal VN to the gate terminal of NMOS transistor 510 and the gate terminal of NMOS transistor 516. Ideally, the measurement circuit should operate according to the waveform in FIG. 6.

Step one: During time interval $t_0$–$t_1$, all MOS transistors are in the shut-off state, and both current meters 502 and 504 register a zero current;

Step two: During time interval time $t_1$–$t_2$, PMOS transistor 506 and PMOS transistor 512 are in a shut-off state, PMOS transistor 508 and PMOS transistor 112 are in a conductive state, and NMOS transistor 510 and NMOS transistor 516 are in a shut-off state. In this period, current meter 502 and current meter 504 both register a zero current;

Step three: During time interval $t_2$–$t_3$, PMOS transistor 506 and PMOS transistor 512 are in a conductive state; PMOS transistor 508 and PMOS transistor 514 are in a conductive state; and NMOS transistor 510 and NMOS transistor 516 are in a shut-off state. In this period, the left wire capacitor $C_{wire}$ (that is, m1 metal strip 518), the right wire capacitor and capacitor $C_{wire}+C_x$ (that is, m1 metal strip 520 and m2 metal strip 522) are charged. Consequently, currents of different sizes pass through the respective current meters 502 and 504;

Step four: During time interval $t_3$–$t_4$, PMOS transistor 506 and PMOS transistor 512 are in a shut-off state, PMOS transistor 508 and PMOS transistor 514 are in a conductive state, and NMOS transistor 510 and NMOS transistor 516 are in a shut-off state. In this period, both current meter 502 and current meter 504 register a zero current;

Step five: During time interval $t_4$–$t_5$, PMOS transistor 506 and PMOS transistor 512 are in a shut-off state; PMOS transistor 508 and PMOS transistor 514 are in a shut-off state; and NMOS transistor 510 and NMOS transistor 516 are in a shut-off state. In this period, both current meter 502 and current meter 504 register a zero current; and Step six: During time interval $t_5$–$t_6$, PMOS transistor 506 and PMOS transistor 512 are in a shut-off state; PMOS transistor 508 and PMOS transistor 514 are in a shut-off state; and NMOS transistor 510 and NMOS transistor 516 are in a conductive state. In this period, the left wire capacitor $C_{wire}$ (that is, m1 metal strip 518), the right wire capacitor and capacitor $C_{wire}+C_x$ (that is, m1 metal strip 520 and m2 metal strip 522) begin to discharge.

In the aforementioned six steps, average current flowing through current meter 502 is $i_{wire}$ and the average current flowing through current meter 504 is $i_{wire+x}$.

The value of capacitance $C_x$ can be deduced using the following formulae:

$$i_{wire+x}=(C_{wire}+C_x)\cdot Vdd\cdot f;$$

$$i_{wire}=C_{wire}\cdot Vdd\cdot f;$$

$$C_x = \frac{I_{wire+x} - I_{wire}}{Vdd\cdot f},$$

where f is the frequency (as shown in FIG. 6).

In practice, at time $t_2$, PMOS transistor 506 and PMOS transistor 512 begin to change from a conductive state to a shut-off state, PMOS transistor 508 and PMOS transistor 514 are in a conductive state, and NMOS transistor 510 and NMOS transistor 516 are in a shut-off state. An equivalent capacitance between the source terminal and the gate terminal of PMOS transistor 506 can be obtained by looking up the gate terminal of PMOS transistor 506. On the other hand, an equivalent capacitance between the gate terminal and the drain terminal of PMOS transistor 506 and an equivalent capacitance between the source terminal and the gate terminal of PMOS transistor 508 connected in series can be obtained by looking down the gate terminal of PMOS transistor 506. Since the gate terminal of PMOS transistor 508 is connected to the ground, the equivalent capacitor between the gate terminal and the drain terminal of PMOS transistor 508 is isolated from the left wire capacitor $C_{wire}$. Similarly, an equivalent capacitance between the source terminal and the gate terminal of PMOS transistor 512 can be obtained by looking up the gate terminal of PMOS transistor 512. An equivalent capacitance between the gate terminal and the drain terminal of PMOS transistor 512 and an equivalent capacitance between the source terminal and the gate terminal of PMOS transistor 514 connected in series can be obtained by looking down the gate terminal of PMOS transistor 512.

Figure 7:
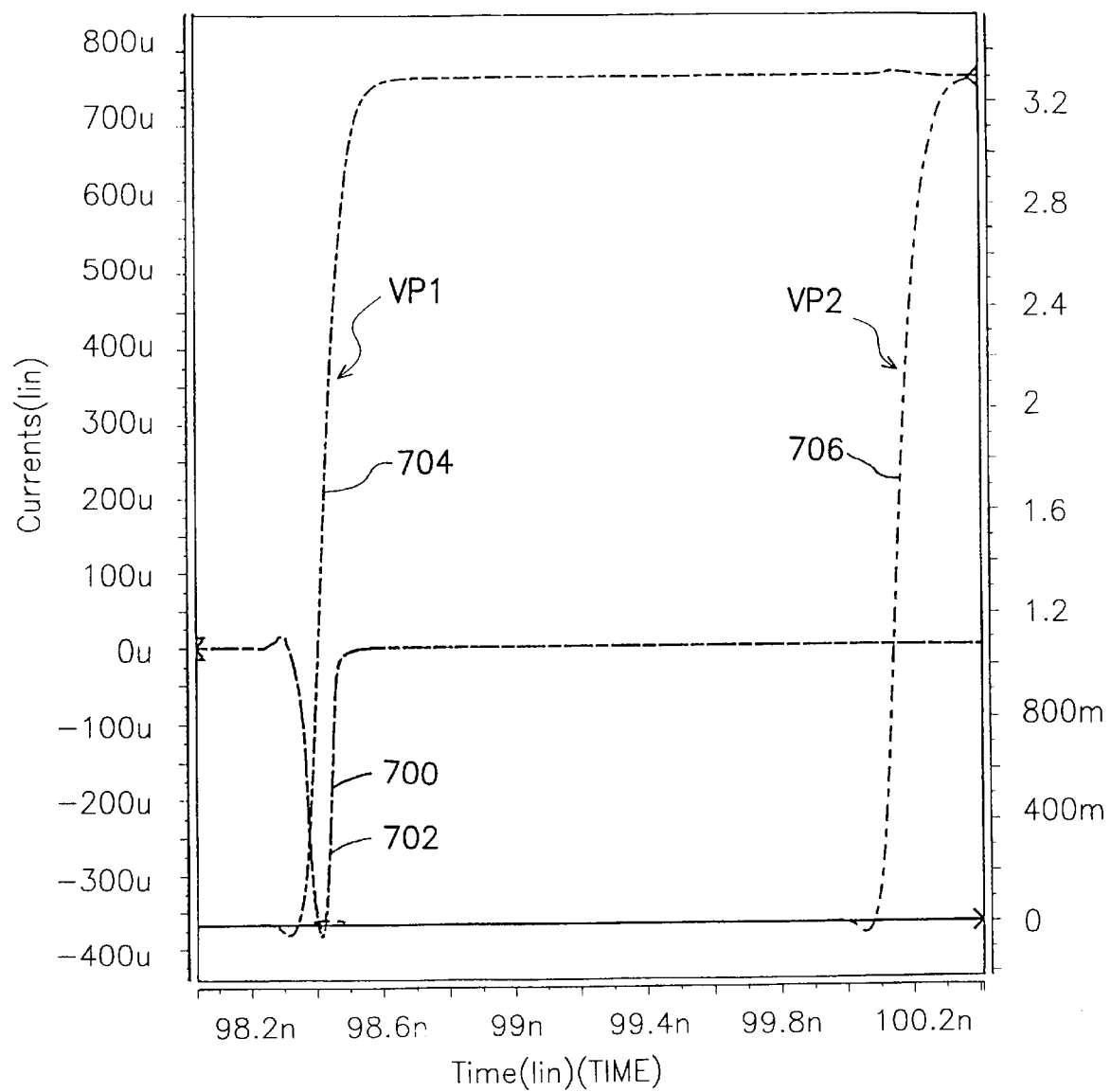
FIG. 7 is a graph showing the time trace of negative current produced by the capacitance measurement circuit of this invention through a SPICE simulation.

At transient time $t_3$ (control signal VP1 704 switched from ground to voltage Vdd as shown in FIG. 7), a negative current $i_{wire}$ flows from the gate terminal of PMOS transistor 506 to current meter 502 and a negative current $i_{wire+x}$ flows from the gate terminal of PMOS transistor 512 to current meter 504. FIG. 7 is a graph showing the time trace of negative current produced by the capacitance measurement circuit of this invention through a SPICE simulation. As shown in FIG. 7, the size of negative current $i_{wire}$ 700 and negative current $i_{wire+x}$ 702 are almost identical. This is because PMOS transistors 506 and 508 on the left and PMOS transistors 512 and 514 on the right match each other completely. Hence, the capacitance obtained by looking up or down the gate terminal of PMOS transistor 506 is identical to the capacitance obtained by looking up or down the gate terminal of PMOS transistor 512.

Similarly, at transient time $t_4$, (control signal VP2 706 changes from ground to voltage Vdd as shown in FIG. 7), both PMOS transistor 506 and PMOS transistor 512 are in a shut-off state and the gate terminal of PMOS transistor 506 and PMOS transistor 512 are connected to the ground. Hence, there is no negative current flowing through current meter 502 and current meter 504 to affect measurement accuracy.

Table 1 is a listing of the capacitance values obtained by simulating the capacitance measurement circuit of this invention and a conventional CBCM circuit using a SPICE program.

TABLE 1

| Cx (pf) | Cref (pf) | Cref + Cx (pf) | Measurement Errors for CBCM circuit | Measurement Errors for silicon chip measurement circuit |
|---------|-----------|----------------|-------------------------------------|---------------------------------------------------------|
| 0.1000  | 0.0001    | 0.1001         | 5.4%                                | 3.3%                                                    |
| 0.0010  | 0.0001    | 0.0011         | 19.7%                               | 13.9%                                                   |
| 0.0010  | 0.0001    | 0.1001         | 1.8%                                | 1.2%                                                    |

In Table 1, the values of three different types of left side capacitor (left wire capacitor $C_{wire}$) and right side capacitor (right wire capacitor $C_{wire}$ and to-be-measured capacitor $C_x$) are used. Through the simulation of a capacitance measurement circuit using a SPICE program, the results of a to-be-measured capacitor between a capacitance measurement circuit of this invention and a conventional CBCM measurement circuit are found. The results of simulation show that capacitance measured by the capacitance measurement circuit of this invention has an overall accuracy increase of between 40% to 60%.

In summary, this invention provides a capacitance measurement circuit capable of limiting measurement error due to the return of different size negative currents due to the transient switching of MOS transistors in the current measurement device. Consequently, accuracy of capacitance measurement is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip capacitance measurement circuit, comprising:
   a measurement circuit having at least three pairs of matched MOS transistors that are connected into a first and second component circuits symmetrical with each other, wherein the first component circuit further includes a first wire capacitor and the second component circuit further includes a second wire capacitor and a to-be-measured capacitor;
   a power source for driving the measurement circuit;
   a current measuring device coupled with the measurement circuit and the power source for measuring currents flowing from the power source to the first and second component circuits to charge the first wire capacitor, the second wire capacitor, and the to-be-measured; and a signal generator coupled with the measurement circuit to control the first and second component circuits;

whereby the capacitance of the to-be-measured capacitor is determined via measuring the charging currents which current flows through the measurement circuit are controlled via the signal generator.

2. The chip capacitance measurement circuit of claim 1, wherein each component circuit is comprised of two PMOS transistors and one NMOS transistor.

3. The chip capacitance measurement circuit of claim 1, wherein the first and second wire capacitors are parasitic capacitors between a metallic layer and a chip substrate, and the to-be-measured capacitor is a parasitic capacitor between metallic layers.

4. The chip capacitance measurement circuit of claim 1, wherein the power supply provides the measurement circuit with a voltage source.

5. The chip capacitance measurement circuit of claim 1, wherein the current measuring device includes a current meter.

6. The chip capacitance measurement circuit of claim 1, wherein the signal generator includes a three-phase non-overlapping signal generator.

7. A chip capacitance measurement circuit, comprising:

a measurement circuit;

a power supply;

a first current meter connected between the measurement circuit and the power supply;

a second current meter connected between the measurement circuit and the power supply; and a signal generator coupled with the measurement circuit to control a current flowing there through;

wherein the first current meter and the second current meter measure the currents flowing from the power supply to the measurement circuit, the signal generator controls a switch of the measurement circuit, and the measurement circuit, having a first wire capacitor, a second wire capacitor, and a to-be-measured capacitor, further includes:

a first pair of matching PMOS transistors that includes a first PMOS transistor and a second PMOS transistor, wherein the source terminal of the first PMOS transistor is connected to the first current meter, the source terminal of the second PMOS transistor is connected to the second current meter, and the gate terminal of the first PMOS transistor and the gate terminal of the second PMOS transistor are connected to a first output terminal of the signal generator;

a second pair of matching PMOS transistors that includes a third PMOS transistor and a fourth PMOS transistor, wherein the source terminal of the third PMOS transistor is connected to the drain terminal of the first PMOS transistor, the source terminal of the fourth PMOS transistor is connected to the drain terminal of the second PMOS transistor, and the gate terminal of the third PMOS transistor and the gate terminal of the fourth PMOS transistor are connected to a second output terminal of the signal generator, and a third pair of matching NMOS transistors that includes a first NMOS transistor and a second NMOS transistor, wherein the first NMOS transistor and the third PMOS transistor have a common drain terminal connection from which the first wire capacitor connects to a ground, the second NMOS transistor and the fourth PMOS transistor have a common drain connection from which the second wire capacitor and the to-be-measured capacitor connect to the ground, the gate terminal of the first NMOS transistor and the gate terminal of the second NMOS transistor are connected to a third output terminal of the signal generator, and the source terminal of the first NMOS transistor and the source terminal of the second NMOS transistor are connected to the ground;

whereby negative currents generated by the measurement circuit and returned to the current measuring devices are identical so that an accurate determination of the capacitance of the to-be-measured capacitor is achieved from measuring charging currents delivered via the power supply to the measurement circuit.

8. The chip capacitance measurement circuit of claim 7, wherein the first PMOS transistor, the third PMOS transistor and the first NMOS transistor have their respective source and drain terminals connected to one another from the first current meter to the ground to form a first component circuit, and the second PMOS transistor, the fourth PMOS transistor and the second NMOS transistor have their respective source and drain terminals connected to one another from the second current meter to the ground to form a second component circuit that is symmetrical with the first component circuit.

9. The chip capacitance measurement circuit of claim 7, wherein the power supply provides the measurement circuit with a voltage source.

10. The chip capacitance measurement circuit of claim 7, wherein the signal generator includes a three-phase non-overlapping signal generator.

11. The chip capacitance measurement circuit of claim 1, wherein the first and second wire capacitors are parasitic capacitors between a metallic layer and a chip substrate, and the to-be-measured capacitor is a parasitic capacitor between the metallic layers.

12. A chip capacitance measurement circuit, comprising:

a power source;

a plurality of current meters connected to the power source;

a signal generator; and a measurement circuit coupled with the signal generator and the current meters, wherein the measurement circuit includes a plurality of component circuits that are coupled with one another and connected to the signal generator, the component circuits being replicated from a basic circuit structure that is comprised of at least two PMOS transistors and a NMOS transistor having their respective drain and source terminals connected to one another from the current meters to a ground, wherein one of the component circuits further includes a to-be-measured capacitor, whereby the capacitance of the to-be-measured capacitor is determined from a current flowing through the measurement circuit that is controlled via the signal generator.

13. The chip capacitance measurement circuit of claim 12, wherein the capacitance of the to-be-measured capacitor is equivalent to a parasitic capacitance between two metallic lines.

14. The chip capacitance measurement circuit of claim 12, wherein each of the component circuits further includes a wire capacitor that is equivalent to a parasitic capacitance structure between a metallic line and a substrate.

15. The chip capacitance measurement circuit of claim 12, wherein the signal generator includes a three-phase non-overlapping signal generator.

* * * * *